United States Patent
Easter et al.

(10) Patent No.: US 6,583,685 B1
(45) Date of Patent: Jun. 24, 2003

(54) ANTENNA ARRANGEMENT

(75) Inventors: Brian Easter, Gwynedd (GB); Keith Jeremy Twort, Stockport (GB); John Davies, Stockport (GB)

(73) Assignee: Glass Antennas Technology Limited, Manchester (GB)

( * ) Notice: Subject to any disclaimer, the term of this patent is extended or adjusted under 35 U.S.C. 154(b) by 0 days.

(21) Appl. No.: 09/142,535
(22) PCT Filed: Nov. 18, 1996
(86) PCT No.: PCT/GB96/02827
§ 371 (c)(1), (2), (4) Date: May 15, 2001
(87) PCT Pub. No.: WO97/33367
PCT Pub. Date: Sep. 12, 1997

(30) Foreign Application Priority Data

Mar. 8, 1996 (GB) .............................................. 9604951

(51) Int. Cl.$^7$ ................................................ H03H 7/01
(52) U.S. Cl. .................. 333/32; 333/217; 342/365; 342/713; 343/704; 343/714
(58) Field of Search ................... 333/32, 174; 343/704, 343/713, 714, 702, 850; 342/365, 713

(56) References Cited

U.S. PATENT DOCUMENTS

| 4,903,035 A | * | 2/1990 | Kropielnicki et al. | ....... 343/704 |
|---|---|---|---|---|
| 5,089,829 A | * | 2/1992 | Haruyama et al. | .......... 343/790 |
| 5,144,324 A | * | 9/1992 | Chin et al. | .................. 343/702 |
| 5,212,491 A | * | 5/1993 | Chin et al. | .................. 343/702 |
| 5,230,096 A | * | 7/1993 | Davies et al. | ................ 455/217 |
| 5,334,988 A | * | 8/1994 | Murakami et al. | .......... 343/704 |
| 5,602,558 A | * | 2/1997 | Urakami et al. | ............ 343/850 |
| 5,699,071 A | * | 12/1997 | Urakami et al. | .............. 333/32 |
| 5,999,135 A | * | 12/1999 | Nozaki et al. | .............. 343/713 |

FOREIGN PATENT DOCUMENTS

| EP | 0083728 | 7/1983 |
|---|---|---|
| EP | 0410705 | 1/1991 |

* cited by examiner

Primary Examiner—Michael Tokar
Assistant Examiner—Lam T. Mai
(74) Attorney, Agent, or Firm—Shoemaker and Mattare

(57) ABSTRACT

A matching circuit for a screen antenna receives on its signal input an MF or LF signal output of a screen antenna and feeds a signal though its signal output via a capacitive feeder to a radio receiver. The matching circuit includes components which operate in conjunction with capacitances in components connected to the signal input and the signal output to form an internally-terminated band-pass filter network having a pass-band which covers a range of frequencies to be received by the receiver.

14 Claims, 6 Drawing Sheets

ANTENNA ARRANGEMENT

The present invention relates to a radio antenna arrangement which includes an arrangement of conductors disposed on a vehicle window to act as a radio signal receiving element, such an antenna arrangement being referred to generally herein as a "screen antenna". More particularly, the invention relates to such antennas for receiving signals in the LF and MF bands.

An antenna for receiving low and medium frequency radio transmissions (in the range 0.14 MHz to 1.6 MHz, which is conventionally abbreviated to LF and MF) for use in a vehicle has traditionally been provided by a whip antenna. Functionally, such an antenna acts as a voltage source with negligible impedance in series with a capacitor, this voltage being fed to a radio receiver along a coaxial feed cable which presents a capacitive coupling between the signal and the vehicle body.

A radio receiver which is intended for use in a vehicle is thus most typically configured for optimum performance when fed with signals from a whip antenna connected to it through up to 4 m of coaxial feeder, since this is the most commonly encountered arrangement. The receiver expects to "see" a pure capacitance on its antenna input.

A disadvantage of such an arrangement is that the capacitance of the feeder causes attenuation of the signal which may be frequency-dependent, depending on the radio input impedance. However, the signal output by a whip antenna is typically sufficiently large that the strength of signal presented to the receiver is sufficient, so the disadvantage is not apparent.

If the whip antenna is replaced by a screen antenna, the loss which occurs in the feeder may be of greater significance. The output from a screen antenna is typically less than that of a whip antenna, with the result that the signal presented to the receiver may be too low to for adequate performance of the receiver. Additional complications arise from the need to provide a connecting module between the screen antenna and the feeder in order to separate the received signals from the DC supply of heating power to the screen heater.

One solution to the problem of isolating the RF signals from the DC supply was to provide a unity-gain amplifier to supply signals from the antenna to the feeder. However, this gave rise to difficulties, in that the relatively low output impedance of the amplifier caused the input seen by the receiver to deviate substantially from the ideal pure capacitance. The result of this was that the receiver was operating with a source impedance different from that with which it was designed to operate, the consequence being that noise or instability could result.

It is well-known that impedance matching between components can be achieved through use of an intervening filter network. A proposed solution to the disadvantages discussed above connects the antenna to the feeder through a band-pass filter configured to provide beneficial impedance matching. However, the response of such filters is not constant over the frequency range of LF and MF radio signals, and they do not present the desired, purely-capacitive load to the receiver. An example of this type of arrangement is disclosed in EP-A-0410705, which also discloses the further refinement of including the capacitance of the feeder in the filter network, so as to reduce the disadvantageous effect of that capacitance.

It is an aim of the invention to provide an antenna arrangement whereby the effect of loss due to capacitance in the coaxial feed can be minimised, and good matching with, and signal transfer to, the receiver achieved, without the need to resort to use of an active circuit.

In arriving at the present invention, it was realised that an aim to be achieved was to transfer a voltage signal from a voltage source with a negligible resistive component (the screen antenna) to a load with a high input impedance (the receiver).

According to a first aspect of the invention there is provided a matching circuit having a signal input and a signal output, the matching circuit being operative to receive on its signal input an MF or LF signal output of a screen antenna and for feeding a signal though its signal output via a capacitive feeder to a radio receiver, the matching circuit comprising components which operate in conjunction with capacitances in components connected to the signal input and the signal output to form an internally-loaded band-pass filter network having a pass-band which covers a range of frequencies to be received by the receiver, and being a predominantly capacitive output over the pass band.

By this arrangement, the capacitances of the feeder and of the antenna itself are absorbed into the filter network, and rather than causing stray and undesirable effects, they contribute towards the desired and predictable functioning of the antenna system.

The network may have a Chebychev, Butterworth or elliptic function characteristic over the pass-band.

The network may be equivalent to a singly-terminated network optimised for transmission of signals between a signal source of defined resistance and a load of negligible or zero resistance. The network may be an even-order filter.

In embodiments according to the last-preceding paragraph, the network may be configured to give optimal input voltage/output current transfer into a short circuit.

In preferred embodiments, the network has a voltage output derived across a capacitance, the capacitance being the last element in the filter, and the capacitance being completely or partially constituted by the capacitance of a feeder to which the signal output of the matching circuit is intended for connection. In this manner, the capacitance of the feeder is a properly functioning part of the network.

In embodiments of a matching circuit of the present invention for use between an output amplifier of a screen antenna and a coaxial feeder connected to a radio receiver, the matching circuit may comprise an odd-order internally-singly-loaded filter network optimised for current transfer into a short circuit.

In embodiments according to the last-preceding paragraph, the last element in the network may be a series capacitor into a short circuit to which the network is connected, an output voltage of the network being derived across the capacitor, and that capacitor being at least in part constituted by the capacitance of a coaxial feeder.

From a second of its aspects, the invention provides MF and/or LF radio reception apparatus comprising an antenna having a signal output and being formed from a pattern of conductive elements applied to a glass pane, an amplifier having an input connected to the signal output of the antenna and having a signal output, a matching circuit according to any preceding claim having its signal input connected to the signal output of the amplifier, a radio receiver having a signal input, and a coaxial feeder connected between the signal output of the matching circuit and the signal input of the radio receiver.

Most typically, in arrangements according to the last-preceding paragraph, the radio receiver is installed in a vehicle and in which the glass pane is a window of the vehicle.

From a third of its aspects, the invention provides a method of optimising a matching circuit for use between an output of a screen antenna and a coaxial feeder connected to a radio receiver for reception of signals over a defined band in the LF and MR range the method comprising the steps of:

(a) devising a base circuit having optimal voltage transfer from a voltage source in series with an impedance to an open circuit over the defined band;

(b) deriving the dual of the base circuit being a bandpass filter circuit arranged such that optimal current flows in a short circuit, its signal output being derived across an output capacitor of value substantially equal to or greater than the capacitance of the feeder, the capacitor being the last element in the bandpass filter circuit;

(c) constructing a circuit omitting the output capacitor, the feeder being connected in substitution for the output capacitor whereby an output of the circuit is derived across the capacitance of the feeder. A matching circuit produced in accordance with the method is also provided.

By such a method, a matching circuit is obtained which is optimised for a particular application and which takes account of the effects upon its performance of surrounding components. The method defined above has the purther property of providing a filter by means of which the reactive component of an impedance experienced by a receiver connected to the feeder has a constant sign (i.e. is either purely capacitive or purely inductive) over the defined band.

Embodiments of the invention will now be described in detail, by way of example, with reference to the accompanying drawings in which.

Generally, to implement a screen antenna in a vehicle, a circuit module is provided which includes all components additional to those required to implement a conventional rear screen heater, and to which all connections for power supply, signal output, and so forth are made. The antenna as a whole will typically provide for reception in the LF, MF and VHF bands. This invention is concerned with reception in the LF and MF bands, and the circuit which it provides will most typically be provided in combination with another circuit for use in VHF reception.

Figure 13:
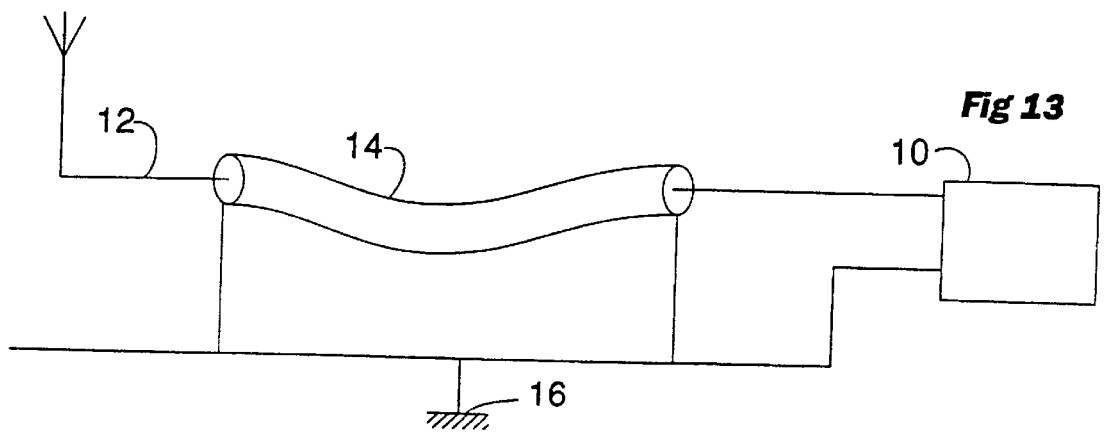
FIG. 13 shows a first typical arrangement of a radio receiver in a vehicle in which the output from a screen antenna is fed to the receiver via a feed.

With reference to FIG. 13, in a typical known arrangement, a radio receiver 10 is connected to an output of an antenna 12 through a length of coaxial feeder 14. The receiver 10, antenna 12 and feeder 14 are connected to a common ground at 16, this normally being a connection to a part of the vehicle body.

Electrically, the antenna 12 is equivalent to a voltage source of negligible impedance in series with a capacitance. This series capacitance acts together with the shunt capacitance of feeder 14 to make a potential divider. Thus, the feeder 14 will transfer signals to the receiver with a constant attenuation across the band.

Figure 14:
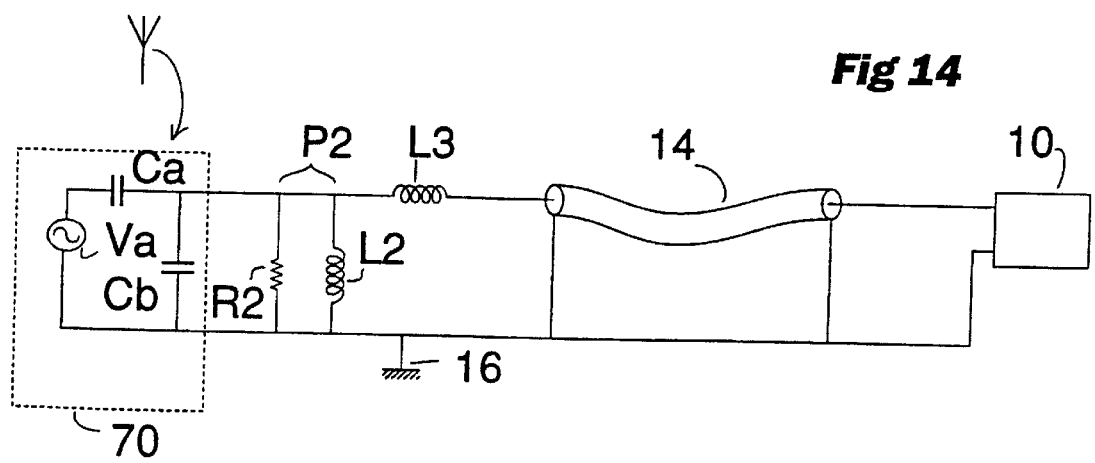
FIG. 14 shows a diagram of an antenna system being another embodiment of the system.

With reference to FIG. 14, an antenna arrangement embodying the invention provides for connection of a receiver 10 to a coaxial feed 14, exactly as in the prior art, so avoiding the need to make any modification to either of these components. However, in this embodiment, a filter circuit is connected between the output of the antenna 12 and the feeder 14.

The filter circuit comprises a first parallel capacitor which includes wholly or partly the self-capacity of between the screen, its connecting leads and the car body Ca & Cb. L2 and R2 are connected across this capacitor, R2 being the internal load of the filter giving ripple control of the response of the filter network. A signal is drawn from a common point P2 between the capacitor CA, first inductor L1 and resistor R2.

At the common point P2, a second inductor L3 is connected to the feeder 14, the capacitance of which is the last element of the filter.

Figure 2:
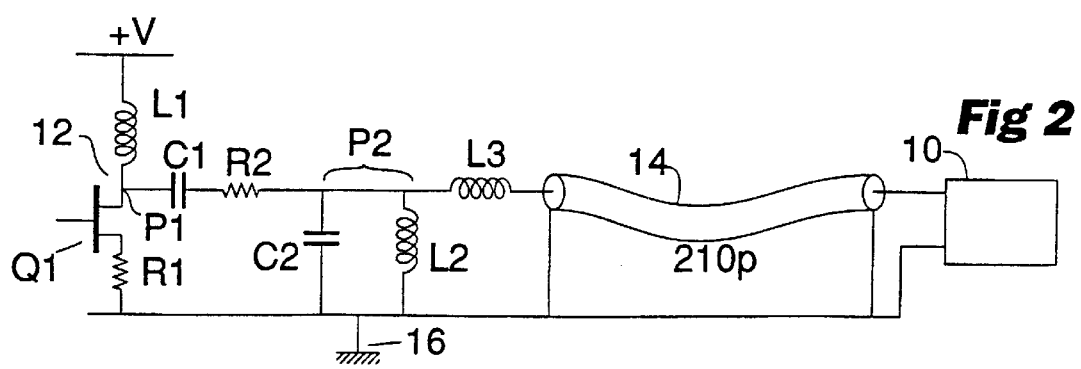
FIG. 2 is a diagram of an antenna system being a first embodiment the invention.

In order that the invention may be more clearly understood, there follows a discussion of the manner in which the circuit of FIG. 2 may be derived.

First, the object of the circuit must be understood: its intention is to transfer a signal with minimum loss in a frequency range of 500 kHz to 1700 kHz from an output of an antenna to a high-impedance input of a radio receiver over a length of feeder cable of, say, 250 pF capacitance. Additionally, it must present the receiver with as near as possible a capacitive load.

Figure 3:
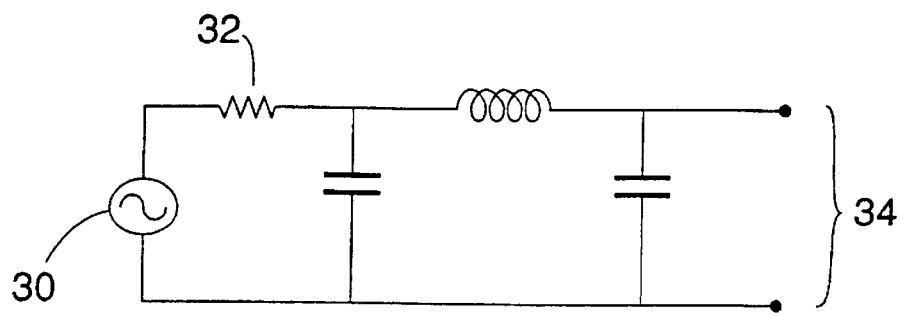
FIGS. 3 to 8 are exemplary circuits used in explanation of the design of the circuit of FIG. 2.

The filter circuit is derived from an odd-order (eg. third-order), low-pass filter. As shown in FIG. 3, this is a singly-terminated Chebychev model, fed with signals from a source 30 having a defined impedance 32 feeding an open-circuit load at 34. This circuit is intended to give optimal voltaae transfer from a voltage source in series with an impedance into an approximation of an open circuit.

Figure 4:
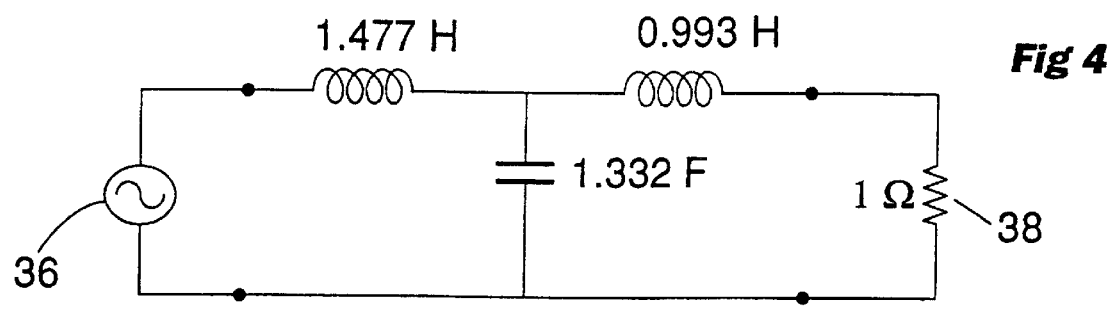

The dual network of the circuit of FIG. 3 is shown in FIG. 4. In this case, the circuit provides optimum current transfer between a voltage source 36 of zero or negligible impedance to a resistive load 38 of defined impedance. Prototype values for the components of the circuit are shown in FIG. 4.

Figure 5:
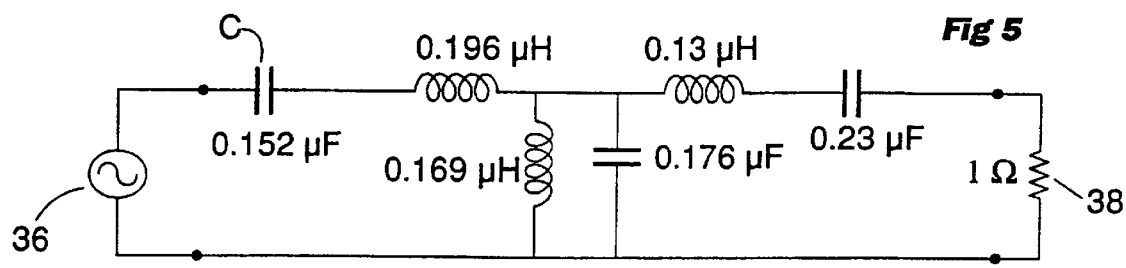

The next step, shown in FIG. 5, is to scale the component values to practical quantities, and to convert the circuit to a bandpass filter with the desired frequency range of 500 kHz to 1700 kHz.

Figure 6:
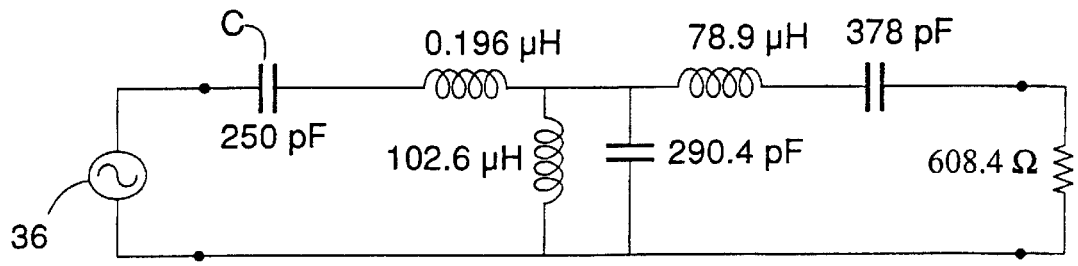

Next, the capacitor labelled C in FIG. 5 is set to a value equal to the capacitance of the feeder cable (250 pF is a typical value in practice) and the other components of the circuit are scaled accordingly. The result is shown in FIG. 6.

Figure 7:
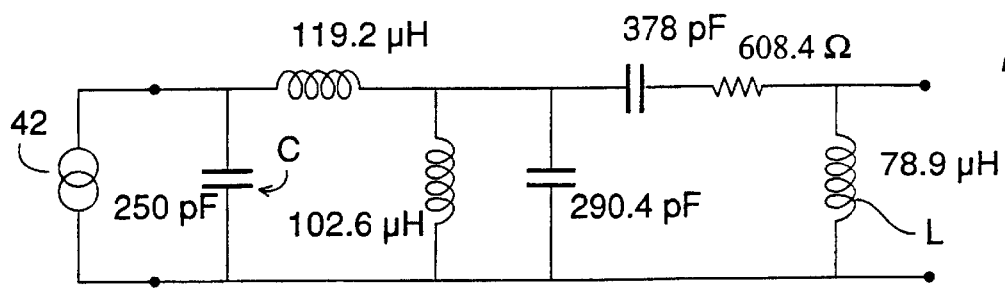

Now, if the series connected, zero resistance voltage source 36 is replaced by a short circuit, and a high impedance current source 42 is connected across the capacitor C (FIG. 7) a falling 6 dB/Octave slope will be superimposed on the response of the network. However, if the voltage is monitored across inductor L in FIG. 7, the voltage obtained will have a compensating 6 dB/Octave rising slope, with the result that the overall response of the network is restored.

Figure 8:
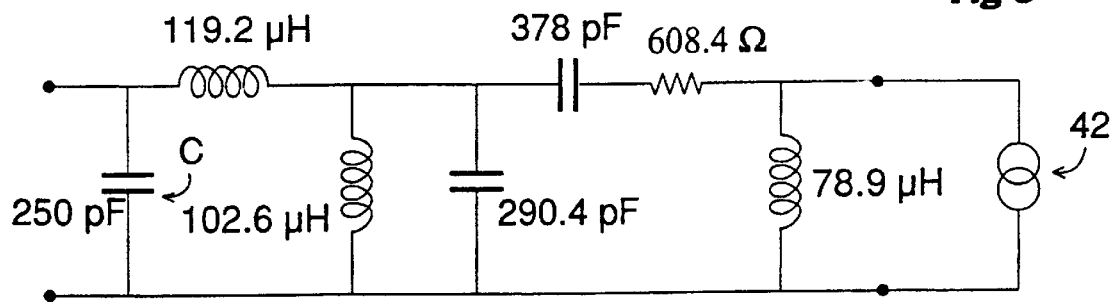

Now, reverse the flow of signals through the network (FIG. 8). A comparison will reveal that the circuit shown in FIG. 8 is functionally identical with that of FIG. 2, with the output amplifier of the antenna 12 being represented by a high-impedance current source 42 and the feeder cable 14 being represented by the capacitor C.

Thus, it will be seen that the circuit of FIG. 2 meets the required criteria of providing a flat frequency response to the receiver, the filter compensating for the feeder cable, and presenting a capacitive source impedance to the receiver 10, this being a function of the capacitance of the feeder C.

Figure 9:
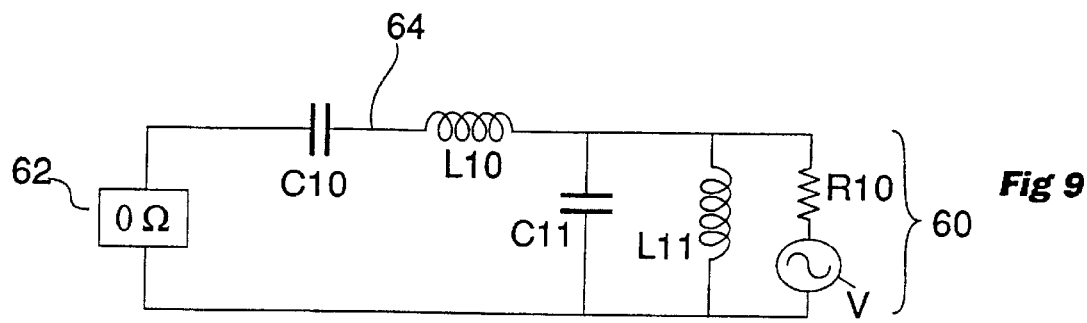
FIG. 9 is a diagram of a singly-terminated band-pass network from which a second embodiment of the invention is derived.

In an alternative embodiment, the starting point is a second-order singly-terminated band-pass filter network, as shown in FIG. 9, optimised to pass signals between a voltage source of finite resistance 60 (voltage source and the resistance being respectively designated V and R10), and a load of negligible resistance 62.

Figure 10:
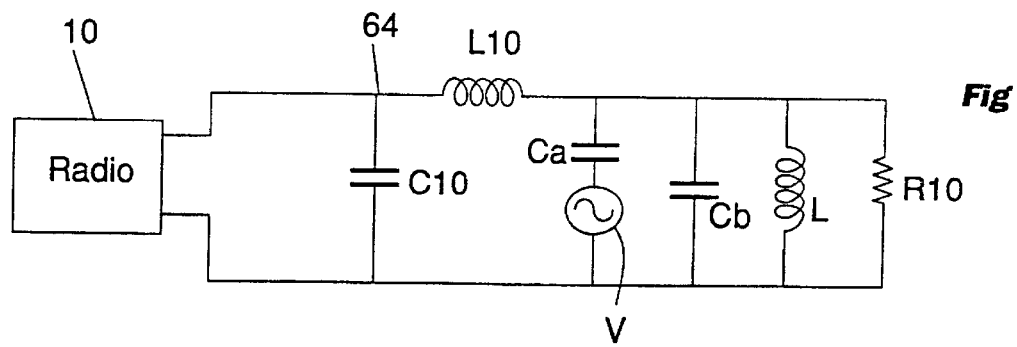
FIG. 10 shows a circuit equivalent to that of FIG. 9 interconnecting a voltage source and a radio receiver.

This circuit may be transformed into an internally loaded network by replacing the load with a short circuit, and deriving the output at a circuit point 64, as shown in FIG. 10. However, it will be seen that the output is now derived across a capacitor C10, and so will be subject to a 6 dB/Octave fall-off. It should be noted that the output is fed to a radio receiver 10, which has a very high input impedance. Therefore, the nature of the output is that of monitoring a voltage, so that operation of the filter network is not disturbed.

To complete the transformation of the network in FIG. 9, the voltage source V should be put in series with the capacitor C11, thereby providing a compensating 6 dB/Octave rising slope. In this particular application, the circuit is further adapted whereby the capacitor C11 is split into capacitors CA and CB where CA+CB=C11, as shown in FIG. 10. The voltage source V is then moved into series with the capacitor CA. Moving the voltage source in this manner has no effect on operation of the network because the source V has no resistance. That the source V is in parallel with CB mimics the situation in practice where the screen antenna has some finite capacitance which appears across the voltage source at its output.

Figure 11:
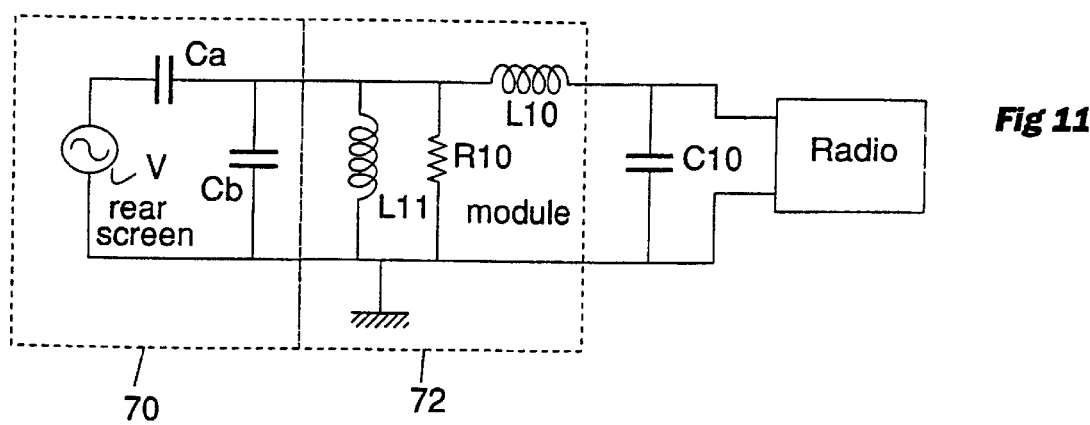
FIG. 11 is a diagram of a circuit having band-pass properties equivalent to that of FIG. 9 interconnecting a screen antenna and a radio receiver.

The circuit of FIG. 11 is simply a topological re-arrangement of that of FIG. 10 to accord more closely with the disposition of its various elements in practice. The Voltage source V, and the capacitors CA and CB are embodied within the screen antenna 70. The inductors L10 and L11, and the resistor R10 are contained within a module 72, and the capacitance C10 is embodied within the feeder.

As a further complication, the module must also supply DC power to the operate the screen heater. Most typically, separation between the DC power and the radio signals is achieved by means of a bifilar coil arrangement, well known to those skilled in the art.

Figure 12:
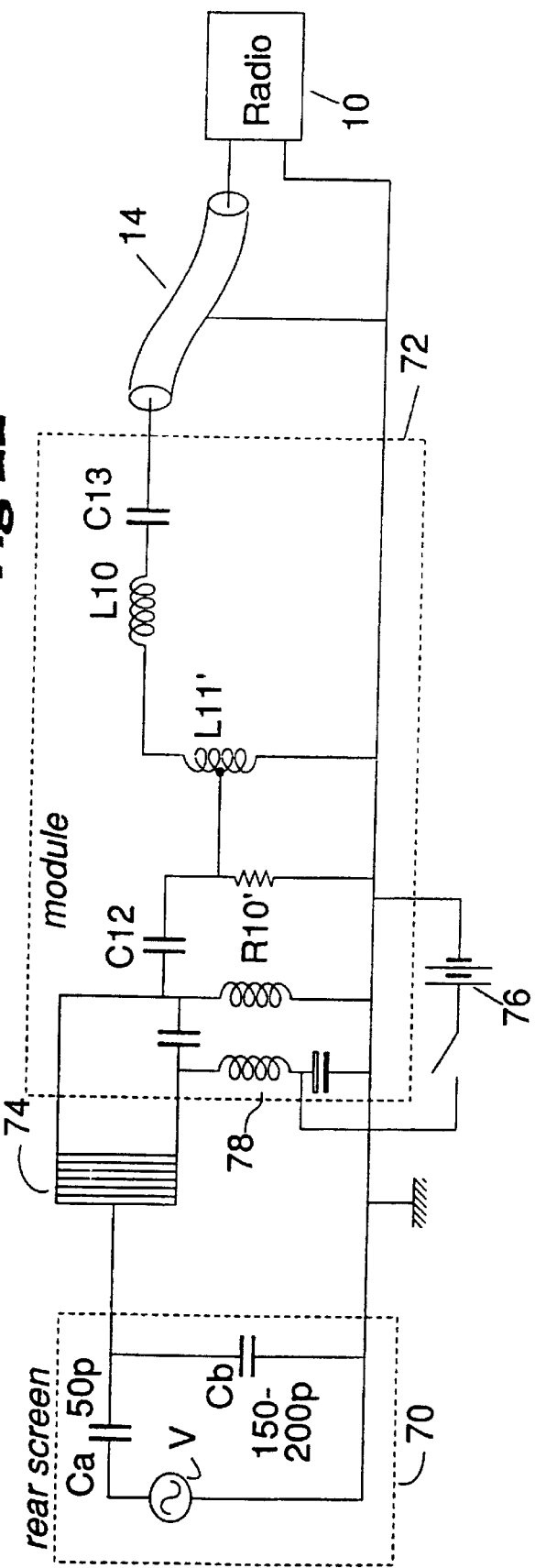
FIG. 12 illustrates the circuit of FIG. 11 as applied in practice to a vehicle.

With reference now to FIG. 12, there is shown the manner in which the circuit is implemented in practice.

A rear screen heater 74 comprises a plurality of heating elements connected in parallel between two busbars. In order to heat the rear screen, DC power is fed from the electrical system of the vehicle (shown schematically at 76) to the busbars through a bifilar choke 78 (or a suitable alternative) within the module 72. The capacitors CA and CB and the voltage source V are models of the heater 74 acting as an antenna to generate radio-frequency signals. A resistor R10' and an inductor L11' are provided which, in combination with the resistance and inductance of the bifilar coil 78, give rise to the values of L11 and R10, as shown in FIG. 11, which are selected to combine with the effect of the bifilar coil 78. The positions of the remaining components can be seen from FIG. 12.

Additional capacitors C12 and C13 are shown in FIG. 12. However, these only provide a block to DC (and are a low-impedance path for RF signals), and do not contribute significantly to the performance of the network.

Figure 1:
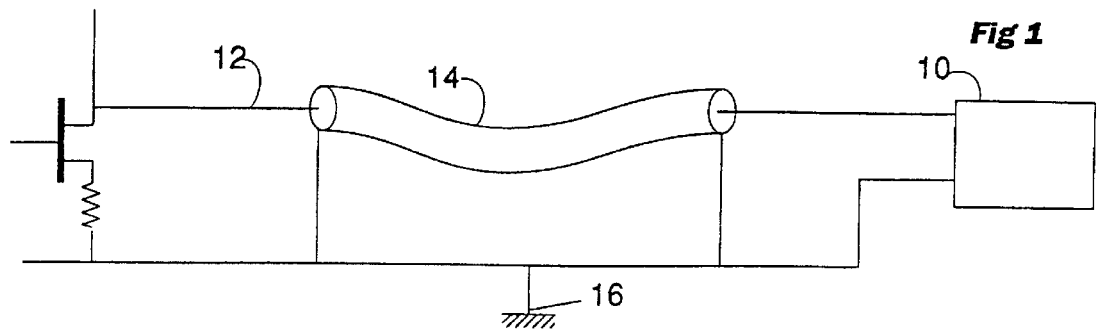
FIG. 1 shows schematically a first typical arrangement of a radio receiver in a vehicle in which output from a screen antenna is derived through an FET amplifier.

With reference to FIG. 1, and with regard to the second embodiment, in a typical known arrangement, a radio receiver 10 is connected to an output of an amplifier 12 of an antenna through a length of coaxial feeder 14. The receiver 10, amplifier 12 and feeder 14 are connected to a common ground at 16, this normally being a connection to a part of the vehicle body.

Electrically, the amplifier 12 is equivalent to a current source of infinite impedance in parallel with an FET drain load inductor (not shown) of the amplifier 12. Effectively, the inductance is in parallel with the capacitance of the feeder 14. Thus, the feeder 14 will transfer signals to the receiver with a band-pass response which will be too narrow to provide a sufficient signal at the receiver.

With reference to FIG. 2, an arrangement embodying the invention provides for connection of a receiver 10 to a coaxial feed 14, exactly as in the prior art, so avoiding the need to make any modification to either of these components. However, in this embodiment, a filter circuit is connected between the output of the amplifier 12 and the feeder 14.

The filter circuit comprises a first inductor L1 which is connected as a drain load to a FET Q1. The FET Q1 is also connected by its source to a ground rail 20, through a first resistor R1, and its gate receives an input signal from a receiving element.

The signal is fed to a first capacitor C1 in series with a second resistor R1, and thence to a second common point P2. At the second common point P2, a second capacitor C2 in parallel with a second inductor L2 are connected to the ground rail 20.

A third inductor L3 connects the second common point P2 to an output of the filter, from which signals are fed to the feeder 14.

Given the following conditions:

Frequency range: 500 kHz to 1700 kHz

Feeder capacitance: 250 pF

The following component values are calculated as ideal:

| L1: | 78.9 µH | C1 | 378 pF |
|---|---|---|---|
| L2: | 102.6 µH | C2 | 290.4 pF |
| L3: | 119.2 µH | R1 | 608.4 Ω |

What is claimed is:

1. A matching circuit having a signal input and a signal output, the matching circuit being operative to receive on its signal input an MF or LF signal output of a screen antenna (70) and for feeding a signal though its signal output via a capacitive feeder (14) to a radio receiver (10), the matching circuit comprising components which operate in conjunction with capacitance in components connected to the signal input and the signal output characterised in that the matching circuit and capacitances in components connected to the signal input and the signal output form an internally-loaded band-pass filter network having a pass-band which covers a range of frequencies to be received by the receiver (10), and present a predominantly capacitive output to the receiver over the pass band.

2. A matching circuit according to claim 1 in which the filter network has a Chebychev, Butterworth or elliptic function characteristic over its pass-band.

3. A matching circuit according to claim 1 or claim 2 in which the network is equivalent to a singly-terminated network optimised for transmission of signals between a signal source of defined resistance and a load of negligible or zero resistance.

4. A matching circuit according to any preceding claim in which the network is an even-order filter.

5. A matching circuit according to claim 3 or claim 4 in which the network is configured to give optimal input voltage/output current transfer into a short circuit.

6. A matching circuit according to any preceding claim in which the network has a voltage output derived across a capacitance (C10), the capacitance being the last element in the filter, and the capacitance being completely or partially constituted by the capacitance of a feeder (14) to which the signal output of the matching circuit is intended for connection.

7. A matching circuit according to claim 1 or claim 2 for use between an output amplifier of a screen antenna and a coaxial feeder (14) connected to a radio receiver (10), the matching circuit comprising an odd-order internally singly loaded filter network optimised for current transfer into a short circuit.

8. A matching circuit according to claim 7 in which the last element in the network is a series capacitor into a short circuit to which the network is connected, an output voltage of the network being derived across the capacitor.

9. MF and/or LF radio reception apparatus comprising an antenna having a signal output and being formed from a pattern of conductive elements (74) applied to a glass pane, an amplifier (12) having an input connected to the signal output of the antenna (74) and having a signal output, a matching circuit according to any preceding claim having its signal input connected to the signal output of the amplifier, a radio receiver (10) having a signal input, and a coaxial feeder connected between the signal output of the matching circuit and the signal input of the radio receiver.

10. MF and/or LF radio reception apparatus according to claim 9 in which the matching circuit is configured such that the sign of the reactive component of the impedance provided on the output from the feeder (14) to the radio receiver (10) is does not change over the band of frequencies to be received by the receiver.

11. MF and/or LF radio reception apparatus according to claim 9 or claim 10 in which the radio receiver is installed in a vehicle and in which the glass pane is a window of the vehicle.

12. MF and/or LF radio reception apparatus according to any one of claims 9 to 11 in which the output of the antenna is constituted by an amplifier.

13. A method of optimising a matching circuit for use between an output of a screen antenna and a coaxial feeder (14) connected to a radio receiver (10) for reception of signals over a defined band in the LF and MR range the method characterised by the steps of:

(a) devising a first circuit (FIG. 3) having optimal voltage transfer from a voltage source in series with an impedance to an open circuit over the defined band;

(b) deriving the dual (FIG. 4) of the base circuit being a bandpass filter circuit arranged such that optimal current flows in a short circuit, its signal output being derived across an output capacitor of value substantially equal to or greater than the capacitance of the feeder, the capacitor being the last element in the bandpass filter circuit;

(c) constructing a circuit (72) omitting the output capacitor, the feeder (14) being connected in substitution for the output capacitor whereby an output of the circuit is derived across the capacitance of the feeder (14).

14. A matching circuit for use between an output of a screen antenna and a coaxial feeder connected to a radio receiver for reception of signals over a defined band optimised by a method according to claim 13.

* * * * *